(12) United States Patent
Fujinami et al.

(10) Patent No.: US 7,776,199 B2
(45) Date of Patent: Aug. 17, 2010

(54) PRINTED WIRING BOARD AND PRODUCTION METHOD THEREOF

(75) Inventors: Hideyuki Fujinami, Sakura (JP); Reiji Higuchi, Sakura (JP); Kazuharu Kobayashi, Sakura (JP)

(73) Assignee: Fujikura Ltd., Tokyo (JP)

( * ) Notice: Subject to any disclaimer, the term of this patent is extended or adjusted under 35 U.S.C. 154(b) by 696 days.

(21) Appl. No.: 10/567,779

(22) PCT Filed: Aug. 11, 2004

(86) PCT No.: PCT/JP2004/011535
§ 371 (c)(1),
(2), (4) Date: Nov. 20, 2006

(87) PCT Pub. No.: WO2005/015966
PCT Pub. Date: Feb. 17, 2005

(65) Prior Publication Data
US 2007/0158104 A1    Jul. 12, 2007

(30) Foreign Application Priority Data
Aug. 12, 2003    (JP)    ............... 2003-292104

(51) Int. Cl.
C25D 5/02    (2006.01)
(52) U.S. Cl. ..................... 205/125; 205/223
(58) Field of Classification Search ............... 205/118, 205/125, 220, 221, 223
See application file for complete search history.

(56) References Cited

U.S. PATENT DOCUMENTS

| 3,940,320 | A | * | 2/1976 | Kardos et al. | ............... 205/298 |
| 6,996,901 | B2 | * | 2/2006 | Honjo et al. | ............... 29/847 |
| 2001/0047943 | A1 | * | 12/2001 | Barstad et al. | ............... 205/123 |

FOREIGN PATENT DOCUMENTS

| JP | 10-56262 | A | | 3/1989 |
| JP | 6-244535 | A | | 9/1994 |
| JP | 6333998 | A | | 12/1994 |
| JP | 06333998 | A | * | 12/1994 |
| JP | 88498 | A | | 1/1996 |

(Continued)

OTHER PUBLICATIONS

"Notice of Rejection Reasons" mailed May 9, 2008 in corresponding Japanese Patent Application No. 2005-513568, which issued as Japanese Patent No. 4195706.

(Continued)

Primary Examiner—Luan V Van
(74) Attorney, Agent, or Firm—Sughrue Mion, PLLC

(57) ABSTRACT

The present invention provides a printed wiring board free from undercuts, which can be formed by an additive method without a dry treatment and a dry treatment apparatus, and a production method thereof. A printed wiring board of the present invention has a conductor circuit free from undercuts which is produced by carrying out additional plating to fill undercuts.

8 Claims, 5 Drawing Sheets

FOREIGN PATENT DOCUMENTS

| | | |
|---|---|---|
| JP | 10-56262 A | 2/1998 |
| JP | 2001-28477 A | 1/2001 |
| JP | 2001-196740 A | 7/2001 |
| JP | 2001196744 A | 7/2001 |
| JP | 2001284749 A | 10/2001 |
| JP | 200323236 A | 1/2003 |
| JP | 2003-045871 A | 2/2003 |
| JP | 2003-45871 A | 2/2003 |
| JP | 2003045871 A * | 2/2003 |

OTHER PUBLICATIONS

"Decision to Grant a Patent" submitted Sep. 11, 2008 in corresponding Japanese Application No. 2005-513568, which issued as Japanese Patent No. 4195706.

"Written Argument" issued Jul. 7, 2007 in corresponding Japanese Patent Application No. 2005-513568, which issued as Japanese Patent No. 4195706.

* cited by examiner

US 7,776,199 B2

PRINTED WIRING BOARD AND PRODUCTION METHOD THEREOF

This application claims priority from PCT Application No. PCT/JP2004/011535 filed Aug. 11, 2004 and from Japanese Application No. 2003-292104 filed Aug. 12, 2003, which applications are incorporated herein by reference.

TECHNICAL FIELD

The present invention relates to a printed wiring board and a production method thereof, and in particular to a printed wiring board having a conductor circuit formed by an additive method and a production method thereof.

BACKGROUND ART

An additive method is known as a method for formation of a circuit of a printed wiring board. In accordance with the additive method, forming resists for plating on a seed layer of a substrate composed of an insulator substrate having a conductive layer (the seed layer) uniformly formed on one side thereof, and forming plating portions respectively at intervals between the resists by electrolytic plating are carried out. After this, by removing the resists for plating and etching and removing the seed layer among the plating portions, a conductor circuit is obtained.

As compared with formation of a conductor circuit by a subtracting method (or an etching method) in which a circuit is formed by etching an conductive layer composed of copper foil uniformly formed on an insulator substrate, the additive method is known to be capable of forming a circuit of thinner linewidth. In view of the state that down-sizing or densifying electronic devices is required, the additive method has a great advantage in this point.

However, the conventional additive method has the following demerits. More specifically, because of occurrence of diffused reflection and such by the seed layer at a time of exposure by photo lithography, bottom portions of resists 103 as a boundary layer with a seed layer 102 come to have base portions 104 widening toward the bottom portions as shown in FIG. 4A. Plating with respect to this state is carried out as shown in FIG. 4B, thereby bottom portions of plating portions 105 have undercut portions 106 as being gouged as shown in FIG. 4C.

After this, though etching is carried out as described above, the undercut portions 106 are eroded more deeply as shown in FIG. 4D. An insulator coating such as a cover lay material or a solder resist material cannot be sufficiently filled in the deep undercut portions 106. It gives rise to possibility to leave gaps therebetween. The gaps may cause migration or such.

Moreover, if the undercuts portions are generated, because a contact area between the conductor circuit and the insulator substrate becomes smaller, an adhesive strength therebetween decreases. It may give rise to possibility that the conductor circuit peels off by a heat treatment. Furthermore, because a cross sectional shape of the conductor circuit fails to be rectangular, a problem of impedance mismatch in high-frequency signal transmission may be induced.

Japanese Patent Unexamined Publication 2001-196740 discloses a method of forming a conductor circuit free from undercuts. In accordance with this method, after removing the base portions of the bottom portions of the resists by a dry treatment, plating for circuit formation is carried out so as to suppress occurrence of the undercuts.

DISCLOSURE OF INVENTION

The dry treatment requires a dry treatment apparatus provided with a large-sized vacuum chamber and such, which requires steps of removing moisture and creating vacuum, thereby it has a problem of causing increase in cost with respect to production of the printed wiring board.

The present invention is intended for providing a conductor circuit free from undercuts which can be produced without a dry treatment and a dry treatment apparatus by the additive method, and a production method thereof.

According to a first aspect of the present invention, a printed wiring board is provided with an insulator substrate; and a conductor circuit provided with a first conductor on the insulator substrate, the first conductor having an undercut portion, a second conductor filling the undercut portion.

Preferably, the printed wiring board is further provided with a conductive seed layer interposed between the insulator substrate and the first conductor, wherein the first conductor is formed on the conductive seed layer by an additive method.

Still preferably, in the printed wiring board, the base portion bulges so that a width from a bottom of the undercut portion to an end of a bulging portion of the base portion is from 1 to 3 times greater than a depth of the undercut portion.

More preferably, in the printed wiring board, the first conductor and the second conductor are respectively composed of materials having a substantially identical thermal expansion coefficient.

Still more preferably, in the printed wiring board, the second conductor and a conductive seed layer interposed between the insulator substrate and the first conductor, the conductive seed layer having etching resistivity.

According to a second aspect of the present invention, a printed wiring board is provided with an insulator substrate; a conductive seed layer on the insulator substrate; and a conductor circuit on the conductive seed layer, the conductive circuit having a plated layer, wherein, from a top view, a contour of the conductive seed layer corresponds to or encloses a contour of the conductor circuit.

According to a third aspect of the present invention, a production method of a printed wiring board is provided with a resist layer formation step of forming a resist layer on a conductive seed layer of a insulator substrate; a photo lithography step of carrying out exposure and development to the resist layer so as to form a resist being patterned for plating on a seed layer of a substrate composed of an insulator substrate having a conductive layer; a plating step of electro-plating a portion of the conductive seed layer, from the portion the resist layer being removed in the photo lithography step, so as to form a conductive circuit; a resist removing step of removing the resist being patterned; and an additional plating step of additionally plating so as to fill an undercut portion which the conductive circuit has.

Preferably, in the production method of the printed wiring board, the additional plating step includes a re-plating step of plating a whole surface after the resist removing step, and a removing step of removing a plating so as to leave a required portion.

More preferably, in the production method of the printed wiring board, the re-plating step is carried out in a high throwing bath or a via filling bath.

Still preferably, in the production method of the printed wiring board, the via filling bath includes an additive agent for relatively promoting plating at a portion where circulation of a plating liquid is inferior. Alternatively, the via filling bath includes an additive agent for suppressing a plating subject from being plated.

BEST MODE FOR CARRYING OUT THE INVENTION

A printed wiring board and a production method in accordance with a first embodiment of the present invention will be described hereinafter with reference to FIGS. 1A through 1H.

Figure 1A:
FIG. 1A is a cross sectional view of a printed wiring board before steps in accordance with a first embodiment of the present invention.

An insulator substrate 11 is a film of a resin such as polyimide as shown in FIG. 1A. A base material of the insulator substrate 11 is not limited to polyimide and various insulator resins capable of being applied to electronic equipments may be used thereto. Instead of polyimide, glass epoxy, aramide epoxy, BT resin, PET and liquid crystal polymer may be applied.

Figure 1B:
FIG. 1B is a cross sectional view of the printed wiring board after formation of a conductive seed layer in accordance with the first embodiment of the present invention.

First, a step of formation of a conductive seed layer is carried out. A nickel thin film is made to grow in thickness of about 300 Å on one face of the insulator substrate 11 and a copper thin film is made to grow in thickness of about 3000 Å further thereon by sputtering to form a conductive seed layer 12 as shown in FIG. 1B. Though the nickel thin film may be replaced by another metal thin layer, a material which has preferable adhesiveness to the insulator substrate 11 should be selected therefor. The copper thin film prevents solution of the nickel thin film in an electrolytic plating bath at a succeeding step. These metals may be replaced by the other metals of high conductivity such as chromium, aluminum, gold, silver, etc.

Next, a resist layer formation step is carried out. A dry film resist is laminated to form a resist layer 13 on the conductive seed layer 12 by roll-laminating or vacuum-laminating. Instead of the dry film resist, a liquid resist may be applied.

Figure 1C:
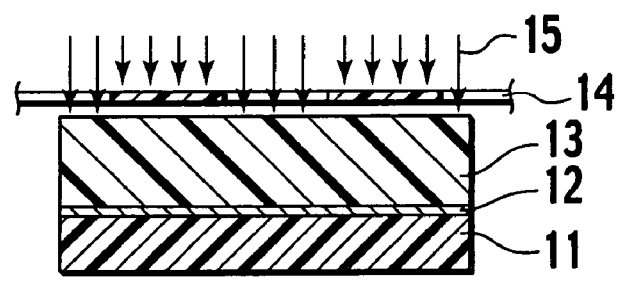
FIG. 1C is a cross sectional view of the printed wiring board at a photo lithography step in accordance with the first embodiment of the present invention.
Figure 1D:
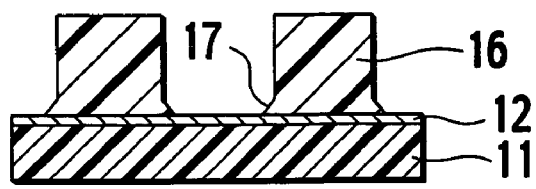
FIG. 1D is a cross sectional view of the printed wiring board after development in accordance with the first embodiment of the present invention.

Next, a photo lithography step is carried out. A mask 14 for resist-patterning is disposed just above the resist layer 13 as shown in FIG. 1C and is irradiated with ultra-violet rays 15. The ultra-violet rays 15 are at least one selected from rays of lengths of 365 nm and 405 nm. Succeedingly by developing it, a resist 16 for plating is formed as shown in FIG. 1D. As a positive type resist is used, portions subject to exposure are removed and the other portions not exposed are left. The resist 16 patterned in this manner has a base portion 17 widening toward a bottom part which is an interface between the resist 16 and the conductive seed layer 12.

Figure 1E:
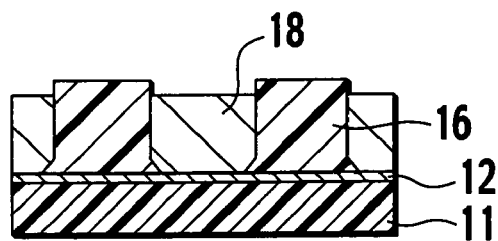
FIG. 1E is a cross sectional view of the printed wiring board after plating in accordance with the first embodiment of the present invention.

Next, a plating step is carried out. An electrolytic copper plating (copper sulfate plating) is carried out to form a plating portion (a first conductor) 18 for a circuit in thickness of about 8 μm at a portion from which the resist layer 13 is removed, as shown in FIG. 1E. In accordance with the electrolytic copper plating, by using a high throwing plating bath, the plating portion (the first conductor) 18 for the circuit can be formed with high efficiency and preferable quality. The plating portion (the first conductor) 18 for the circuit composes a main part of a conductive circuit.

Figure 1F:
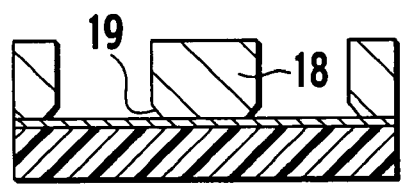
FIG. 1F is a cross sectional view of the printed wiring board after removing a resist in accordance with the first embodiment of the present invention.

Next, a resist removal step is carried out. The resist 16 for plating is thoroughly removed as shown in FIG. 1F by spraying a proper remover agent. In this occasion, the bottom portion 17 is imprinted in the plating portion (the first conductor) 18 for the circuit to form an undercut portion 19 around a bottom part, namely an interface to the conductive seed layer 12, thereof. The aforementioned steps are substantially identical to those of formation of a circuit in accordance with the prior additive method.

Next, an additional plating step composed of a re-plating step and a removal step is carried out.

Figure 1G:
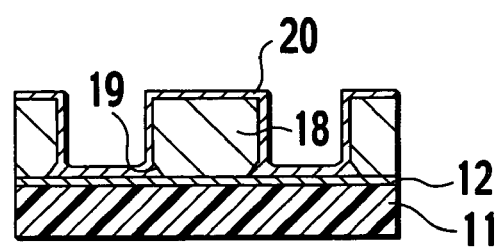
FIG. 1G is a cross sectional view of the printed wiring board after re-plating in accordance with the first embodiment of the present invention.

In the re-plating step, a whole surface is re-plated by copper sulfate plating to form an additional plated layer (a second conductor) 20 so as to fill the undercut portion 19 as shown in FIG. 1G. The high throwing plating bath or a via filling plating bath as described later may be applied to a bath for re-plating.

In the re-plating step, an additive agent for throughhole-plating commercially available in a trade name of "COPPER GLEAM CLX" (LEARONAL JAPAN INC.), another additive agent for a filled via commercially available in a trade name of "TOP LUCINA BVF" (OKUNO CHEMICAL INDUSTRIES CO., LTD.), or the other additive agent for filled via/throughhole co-plating commercially available in a trade name of "TOP LUCINA α" (OKUNO CHEMICAL INDUSTRIES CO., LTD.) is added to the plating bath.

The additive agent for throughhole-plating has a function of improving uniformity of plating thickness, namely throwing power, and is hence added to the high throwing plating bath.

A filled via means a via of a multilayer board or a double-sided board with metal filling the via without space formed by plating. The additive agent for the filled via has a function of suppressing plating of a subject to be plated. The function more effectively occurs around a surface of a substrate as circulation of plating liquid is good there, and the function is inferior in the interior of a via as circulation is bad there. Therefore, relatively, plating in the interior of the via is promoted as compared with the surface. Accordingly, the additive agent promotes a function of filling a via with metal.

According to the present embodiment of the present invention, by applying the aforementioned function of the additive agent for the filled via, the undercut portion 19 where circulation of the plating liquid is relatively inferior is preferentially plated.

A typical constitution of a plating bath and a plating condition applied to a case where a depth of the undercut portion 19 measured from a side wall of the plating portion (the first conductor) 18 for the circuit is about 1 μm is as follows. In the following description, a target film thickness is capable of being regulated by a current density and a current-carrying time with ease.

(In a Case of a High Throwing Plating Bath)

A concentration of copper sulfate: 60-90 g/l, sulfuric acid: 165-210 g/l, chloride ion: 30-75 mg/l, an additive agent for a throughhole plating, COPPER GLEAM CLX-A (LEARONAL JAPAN INC.): 5-15 ml/l, current densities: 0.1-4 A/dm$^2$, target film thickness: 0.5-1 μm.

(In a Case of a Via Filling Plating Bath)

A concentration of copper sulfate: 160-240 g/l, sulfuric acid: 40-80 g/l, chloride ion: 30-70 mg/l, an additive agent for filled via plating, TOP LUCINA BVF (OKUNO CHEMICAL INDUSTRIES CO., LTD.): 2-10 ml/l, current densities: 0.1-5 A/dm$^2$, target film thickness: 0.2-3 μm.

Figure 2A:
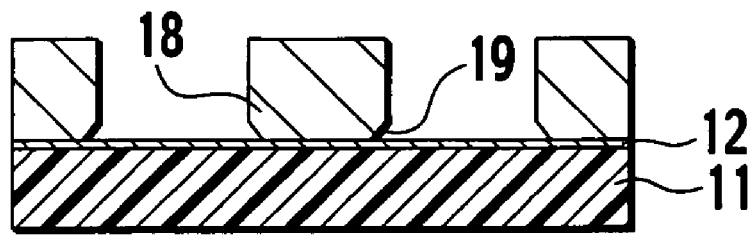
FIG. 2A shows a state having undercut portions before re-plating.

In a case where the re-plating step is carried out with respect to the undercut portion 19 in a state shown in FIG. 2A, smaller plating thickness is preferable so as to ease removal of the conductive seed layer 12 at a removal step described later. On the other hand, it is required to sufficiently fill the undercut portion 19 with plating.

Figure 2B:
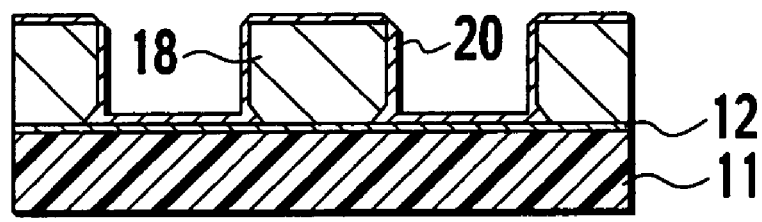
FIG. 2B is a cross sectional view illustrating a case where an additional plated layer is formed by a high throwing bath.

In the case of plating by the high throwing bath, because a subject to be plated is substantially uniformly plated as shown in FIG. 2B, target thickness is required to be 0.5-1 μm to fill the undercut portion 19 having a depth of about 1 μm.

In the case of plating by the via filling bath, because vicinities of the undercut portion 19 are preferentially plated, the above target thickness may be resultantly excessive. Therefore, target thickness is preferably thinner, optimally 0.2-0.5 μm.

Next, the removal step is carried out. The conductive seed layer 12 and the additional plating layer (the second conductor) 20 are removed by etching so as to leave required portions, namely a portion intervening between the plating portion (the first conductor) 18 for the circuit and the insulator substrate 11 and a portion filling the undercut portion 19.

Figure 1H:
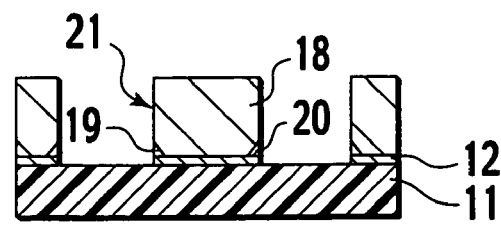
FIG. 1H is a cross sectional view of the printed wiring board after removal of plating in accordance with the first embodiment of the present invention.

Thus, from the plating portion (the first conductor) 18 for the circuit and the residual portions of the additional plating layer (the second conductor) 20, as shown in FIG. 1H, a conductor circuit 21 free from undercuts is obtained. Then, because the conductor circuit 21 has a shape which hardly generates undercuts, generation or propagation of undercuts is not brought about by etching. Moreover, selection of an etching liquid may be capable from broader choices. Furthermore, when seen from a top view, a contour of conductive seed layer 12 and a contour of the conductor circuit 21 are substantially correspondent with each other. Moreover, a cross sectional shape of the conductor circuit 21 is substantially rectangular.

Figure 2C:
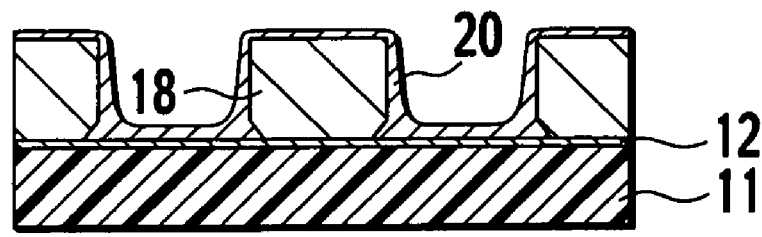
FIG. 2C is a cross sectional view illustrating a case where an additional plated layer is formed by a via filling bath.
Figure 3A:
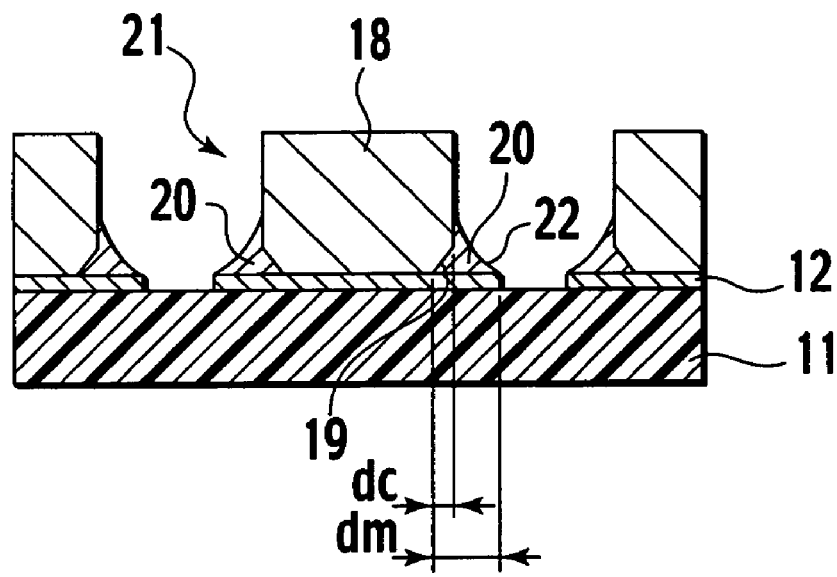
FIG. 3A is a cross sectional view of a printed wiring board after removal of plating in accordance with a second embodiment of the present invention.

Meanwhile, the conductor circuit 21 may be formed to have a base portion 22 widening toward a bottom part thereof as shown in FIG. 3A. For example, in the re-plating step as described above, using the via filling bath and setting the target thickness from 0.5 μm to 3 μm lead to that vicinities of the undercut portion 19 has thicker plating than the other part as shown in FIG. 2C. As the removal step is carried out with respect to this, the conductor circuit 21 having the base portion 22 is formed. When seen from a top view, a contour of the conductive seed layer 12 is larger than and encloses a contour of the conductor circuit 21. A cross sectional shape of the conductor circuit 21 taken from a section perpendicular to a direction where the circuit runs is a bell bottom shape as an upper part thereof is wider than a lower part thereof. Thereby newly generated undercuts at the removal step can be prevented. Moreover, because the base portion 22 increases adhesiveness of the conductor circuit 21 to the insulator substrate 11 and suppresses crack occurrence, it effectively prevents the conductor circuit 21 from peeling off at a succeeding step of plating with nickel, gold and such for a purpose of corrosion prevention. If bulging of the base portion 22 is too great, a problem of insulation may occur, and if too small, a sufficient effect cannot be expected. Accordingly, a width dm from a bottom of the undercut portion 19 to an end of a bulging portion of the base portion 22 is preferably from 1 to 3 times greater, and more preferably from 1.5 to 2 times greater, than a depth dc of the undercut portion 19.

Figure 3B:
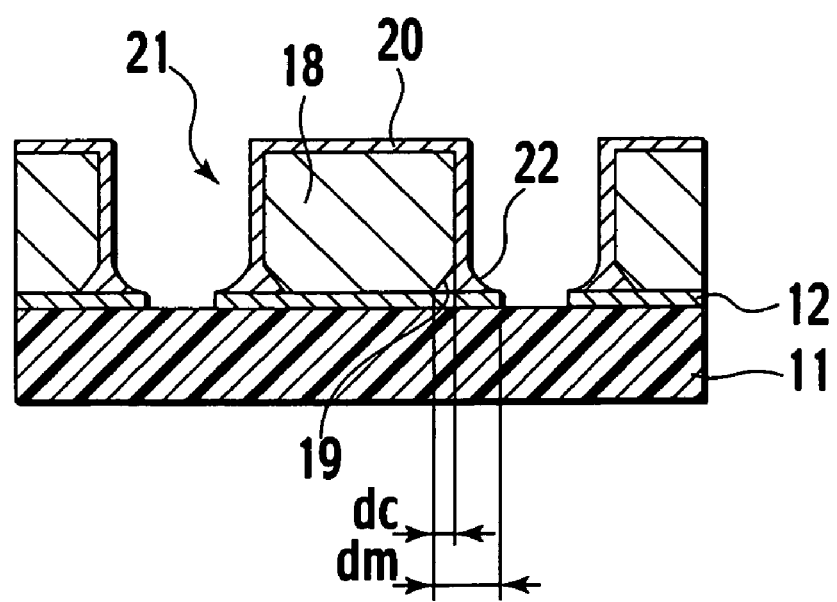
FIG. 3B is a cross sectional view of a printed wiring board after removal of plating in accordance with a modified version of the second embodiment of the present invention.
Figure 4A:
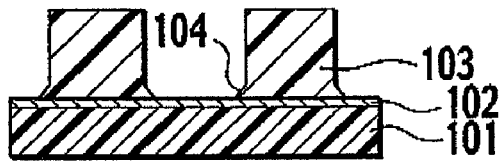
FIG. 4A is a cross sectional view of a printed wiring board after a photo lithography step in accordance with a prior art.
Figure 4B:
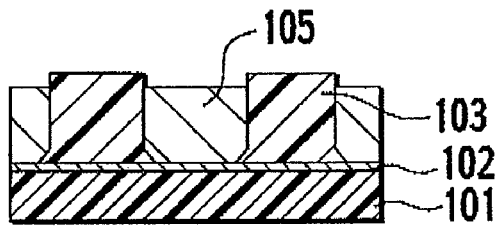
FIG. 4B is a cross sectional view of the printed wiring board after plating in accordance with the prior art.
Figure 4C:
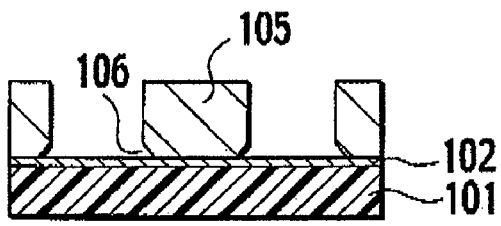
FIG. 4C is a cross sectional view of the printed wiring board after removing a resist in accordance with the prior art.
Figure 4D:
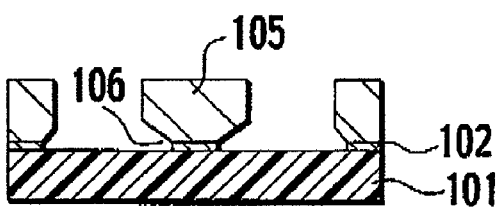
FIG. 4D is a cross sectional view of the printed wiring board after removal of plating in accordance with the prior art.

Meanwhile, as shown in FIG. 3B, after the removal step, the additional plating layer (the second conductor) 20 may be slightly remained.

Furthermore, the plating portion (the first conductor) 18 for the circuit and the additional plating layer (the second conductor) 20 are preferably made to have substantially identical thermal expansion coefficient, and more preferably made of identical metal. Thereby generation of thermal stress by a heat treatment and such in succeeding steps can be prevented and consequently generation of defects such as crack or peeling is prevented.

Moreover, the conductive seed layer 12 and the additional plating layer (the second conductor) 20 preferably have substantially equal resistances to etching. Thereby newly generated undercuts are prevented.

Although the invention has been described above by reference to certain embodiments of the invention, the invention is not limited to the embodiments described above. Modifications and variations of the embodiments described above will occur to those skilled in the art, in light of the above teachings.

INDUSTRIAL APPLICABILITY

A printed wiring board free from undercuts, which can be formed by an additive method without a dry treatment and a dry treatment apparatus, and a production method thereof are provided.

The invention claimed is:

1. A production method of a printed wiring board, comprising:
   a resist layer formation step of forming a resist layer on a conductive seed layer of a insulator substrate;
   a photo lithography step of carrying out exposure and development to the resist layer so as to form a resist being patterned for plating on a seed layer of a substrate composed of an insulator substrate having a conductive layer;

a plating step of electro-plating a portion of the conductive seed layer, from the portion the resist layer being removed in the photo lithography step, so as to form a conductive circuit;

a resist removing step of removing the resist being patterned;

an additional plating step of filling an undercut portion of the conductive circuit by electro-plating to form an additional plating layer; and a removing step of removing at least a portion of the additional plating layer.

2. The production method of the printed wiring board of claim 1, wherein the additional plating step includes a re-plating step of plating a whole surface after the resist removing, step.

3. The production method of the printed wiring board of claim 2, wherein the re-plating step is carried out in a high throwing bath.

4. The production method of the printed wiring board of claim 2, wherein the re-plating step is carried out in a via filling bath.

5. The production method of the printed wiring board of claim 4, wherein the via filling bath includes an additive agent for relatively promoting plating at a portion where circulation of a plating liquid is inferior.

6. The production method of the printed wiring board of claim 4, wherein the via filling bath includes an additive agent for suppressing a plating subject from being plated.

7. The production method of the printed wiring board of claim 1, wherein the additional plating step comprises filling the undercut portion of the conductive circuit by electro-plating with a target film thickness of 0.5 μm to 1 μm.

8. The production method of the printed wiring board of claim 1, wherein the additional plating step comprises filling the undercut portion of the conductive circuit by electro-plating with a target film thickness of 0.2 μm to 0.5 μm.

* * * * *